United States Patent
Funato et al.

(10) Patent No.: US 7,604,484 B2
(45) Date of Patent: Oct. 20, 2009

(54) CIRCUIT BOARD INCLUDING ARRANGEMENT FOR MEASURING CURRENT THROUGH A JUNCTION PART OR CONNECTOR OF SAID CIRCUIT BOARD

(75) Inventors: Hiroki Funato, Hitachinaka (JP); Takashi Suga, Yokohama (JP); Tsutomu Hara, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 139 days.

(21) Appl. No.: 11/670,559

(22) Filed: Feb. 2, 2007

(65) Prior Publication Data
US 2007/0207636 A1    Sep. 6, 2007

(30) Foreign Application Priority Data
Mar. 6, 2006    (JP) .............................. 2006-058852

(51) Int. Cl.
H01R 12/00    (2006.01)
(52) U.S. Cl. ...................................... 439/68
(58) Field of Classification Search ................ 439/67, 439/68, 71; 335/205; 361/748, 760, 761; 336/65, 234, 200
See application file for complete search history.

(56) References Cited

U.S. PATENT DOCUMENTS

| | | | |
|---|---|---|---|
| 3,649,939 A * | 3/1972 | Hildebrandt | 336/65 |
| 7,005,955 B2 * | 2/2006 | Schumacher | 336/200 |
| 7,151,298 B1 * | 12/2006 | Eggert et al. | 257/355 |
| 7,170,384 B2 * | 1/2007 | Kim et al. | 336/200 |
| 7,187,263 B2 * | 3/2007 | Vinciarelli | 336/200 |
| 7,423,884 B2 * | 9/2008 | Enchi et al. | 361/761 |
| 2005/0035836 A1 * | 2/2005 | Howard et al. | 335/205 |
| 2007/0013541 A1 * | 1/2007 | Harazin et al. | 340/825.49 |

FOREIGN PATENT DOCUMENTS

| | | |
|---|---|---|
| JP | 07-225634 | 8/1995 |
| JP | 10-190166 | 7/1998 |
| JP | 2002-156430 | 5/2002 |

OTHER PUBLICATIONS

The Convention of Communication Society in 2005 of the Institute of Electronic Information and Communication Engineers of Japan, issued on Sep. 7, 2005, A Study on Junction-Current between PCB and Chassis.

* cited by examiner

*Primary Examiner*—Chandrika Prasad
(74) *Attorney, Agent, or Firm*—Antonelli, Terry, Stout & Kraus, LLP.

(57) ABSTRACT

A circuit board having: a through hole to mount the circuit board to a casing or an electronic apparatus; and a coil-shaped conductive pattern provided on a plane perpendicular to the through hole so as to intersect a circumference around the through hole as a center.

20 Claims, 8 Drawing Sheets

- CIRCUIT BOARD 102
- 103 GND
- 106 CONNECTOR
- 101 JUNCTION

- CONNECTOR 106
- JUNCTION 101
- 103 GND
- LEAD-OUT PORTION 105
- 104 CONDUCTIVE PATTERN FOR DETECTION OF JUNCTION CURRENT

- COMPUTER 205
- 206 DISPLAY APPARATUS
- CABLE 202
- 102 CIRCUIT BOARD
- 201 CASING
- MEASURING INSTRUMENT 203
- 204 FILTER OR AMPLIFIER

CONDUCTIVE PATTERN FOR DETECTION OF JUNCTION CURRENT 104

301 JUNCTION CURRENT

302 MAGNETIC FIELD

CIRCUIT BOARD 102

103 GND

106 CONNECTOR

101 JUNCTION

401 JUNCTION FILTER

CIRCUIT BOARD INCLUDING ARRANGEMENT FOR MEASURING CURRENT THROUGH A JUNCTION PART OR CONNECTOR OF SAID CIRCUIT BOARD

INCORPORATION BY REFERENCE

The present application claims priority from Japanese application JP2006-058852 filed on Mar. 6, 2006, the content of which is hereby incorporated by reference into this application.

BACKGROUND OF THE INVENTION

The invention relates to a circuit board having functions for measuring and adjusting intensity and a phase of a current flowing in a junction of the circuit board and an electronic apparatus or a casing and also relates to an electronic apparatus in which such a circuit board has been mounted.

In an electronic apparatus or the like, in order to specify a position of a current which becomes a cause of generation of an unnecessary electromagnetic radiation and an electromagnetic mutual interference path between electronic apparatuses or electronic circuits which becomes a cause of the erroneous operation, performance deterioration, or the like, a technique for measuring distribution of magnetic fields near the electronic apparatus is effective.

Generally, to specify the radiating position of the unnecessary electromagnetic radiation radiated from the circuit board sole body, by measuring the distribution of the neighboring magnetic fields on the circuit board by using a magnetic field probe, the position of the current which becomes the cause of generation of the radiation can be specified (for example, refer to JP-A-2002-156430). To specify the radiating position of the unnecessary electromagnetic radiation radiated from the electronic apparatus casing, by measuring the distribution of the magnetic fields near the casing, an examination similar to that for the circuit board sole body can be made.

As a technique for reducing the unnecessary electromagnetic radiation from the casing or the like, a method whereby a filter is inserted into a connecting portion between the circuit board and the casing or the like and intensity, a phase, and a frequency of a current flowing out to the casing or the like are controlled has been shown (for example, refer to JP-A-7-225634 and JP-A-10-190166).

SUMMARY OF THE INVENTION

Generally, an exciting source of the unnecessary electromagnetic wave radiated from the circuit board sole body is an element such as LSI, crystal oscillator, or the like. An antenna which radiates an electromagnetic energy into the air often has a pattern of a signal or a GND (ground). A countermeasure for reducing the unnecessary electromagnetic radiation is taken by a layout change of a PCB, a circuit change, or the like. An EMI (Electro-Magnetic Interference) countermeasure is taken as a circuit board sole body.

However, even if the EMI countermeasure of the circuit board sole body is completely taken as mentioned above, there is such a problem that at a point of time when the circuit board is mounted on the casing (frame, chassis, or the like) for enclosing the board, a level of the unnecessary electromagnetic radiation changes and a new EMI countermeasure is necessary. This is because the whole board operates as an exciting source and the casing functions as an antenna. As for such a problem, in many cases, a correlation between a measurement result of the neighborhood magnetic field on the board and a far field upon mounting of the casing cannot be obtained and it takes a time for the countermeasure in the circuit board. Even if it is intended to take the EMI countermeasure on the casing side, generally, since the casing often has a three-dimensional complicated shape, it is difficult to measure the current distribution, so that it takes a time and costs are high. Further, also in the case of inserting the filter into the junction between the circuit board and the casing, since a path of the current which becomes the cause of the casing radiation as a target to be reduced and electric characteristics are obscure, it is difficult to promptly obtain effective characteristics.

The invention is made to solve such problems. That is, it is an object of the invention to provide a circuit board having functions in which in order to take the EMI countermeasure more promptly, a current which becomes a problem when a circuit board is mounted in an electronic apparatus or a casing and which flows out from the circuit board to the electronic apparatus or the casing through a junction part can be measured in the mounting state in a junction on the circuit board and, further, characteristics of the current are adjusted and to provide the electronic apparatus on which the circuit board has been mounted.

An outline of typical ones of the inventions disclosed in the present application will be simply described as follows.

(1) A circuit board having: a through hole adapted to mount the circuit board to a casing or an electronic apparatus; and a coil-shaped conductive pattern provided on a plane perpendicular to the through hole so as to intersect a circumference around the through hole as a center.

(2) A circuit board having: a through hole adapted to mount the circuit board to a casing or an electronic apparatus; and a wound conductive pattern formed in the circuit board so as to surround the through hole, wherein the conductive pattern is a coil-shaped conductive pattern provided in such a manner that when a conductive junction part is mounted in the through hole, the conductive pattern intersects a magnetic flux of a magnetic field which is caused by a current flowing in the junction part.

(3) An electronic apparatus comprising: a casing; a circuit board; and a junction part which joins the casing and the circuit board, wherein the circuit board has a coil-shaped conductive pattern provided on a plane perpendicular to the junction part so as to intersect a circumference around the junction part as a center.

(4) An electronic apparatus comprising: a casing; a circuit board; and a junction part which joins the casing and the circuit board, wherein the circuit board has a coil-shaped conductive pattern provided so as to intersect a magnetic flux of a magnetic field which is caused by a current flowing in the junction part.

These and other objects, features and advantages of the invention will be apparent from the following more particular description of preferred embodiments of the invention, as illustrated in the accompanying drawings.

DESCRIPTION OF THE EMBODIMENTS

The invention relates to a circuit board for measuring a current flowing out from the circuit board to a casing or an electronic apparatus in a junction of the circuit board and enabling the current to be adjusted.

That is, the circuit board of the invention is characterized in that a sensor, for example, a coil-shaped conductive pattern for detecting an electromagnetic field which is generated by a current flowing in a junction part is provided in a peripheral portion of a through hole for the junction part with the casing or the electronic apparatus. Since the coil-shaped conductive pattern is arranged around the junction part in the circuit board, when the circuit board is mounted in the casing or the like, the electromagnetic field generated by a junction current flowing through the junction part (screw or the like) attached to the junction can be detected in the mounting state and in an actual operating state of the circuit board. Further, since the circuit board has a lead-out portion electrically connected to the coil-shaped conductive pattern, an obtained junction current signal can be transmitted to an external measuring instrument. Thus, an EMI cause current flowing out from the circuit board when the circuit board is made operative in the state where it has been mounted in an actual system such as a casing or the like can be measured.

Further, a filter circuit or a filter circuit mounting portion for adjusting the junction current is provided on the circuit board and the filter is enabled to be adjusted while measuring the EMI cause current flowing in the junction, so that an unnecessary electromagnetic radiation can be reduced.

A feedback function unit is further provided, the detected junction current is electrically fed back to the filter circuit, and electric characteristics of the filter provided for the junction is automatically adjusted, so that characteristics of the current flowing out to the outside can be also optimized.

The invention intends to provide a circuit board for enabling a countermeasure to measure the EMI generated by the whole system in the state where the circuit board has been mounted in the casing or the electronic apparatus and reduce the EMI to be taken and to provide the electronic apparatus on which the circuit board has been mounted.

In the present application, the "junction" merely denotes the through hole provided to join with the casing, the electronic apparatus, or the like and the peripheral portion of the through hole in the circuit board. However, in the case where the junction part of the conductor such as a screw or the like has been attached to the through hole, the "junction" denotes portions including the junction part.

A specific embodiment of the invention will be described hereinbelow with reference to the drawings.

Figure 1A:
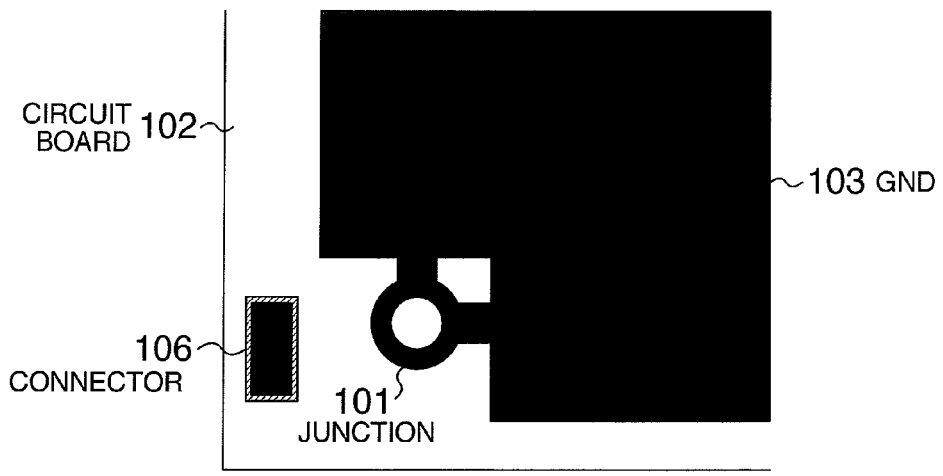
FIGS. 1A and 1B are a top view and a cross sectional view of a structure of a circuit board, respectively.
Figure 1B:
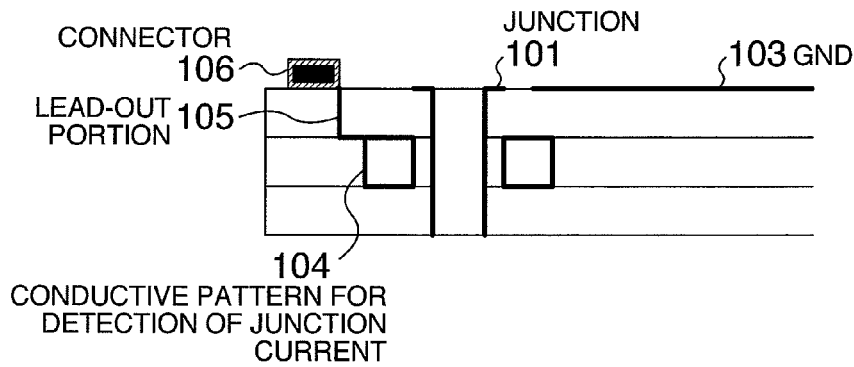

FIGS. 1A and 1B are a top view and a cross sectional view, respectively, of a structure of a circuit board 102 having a junction current detecting function for measuring intensity and a phase of a current flowing in a junction 101 with the circuit board and the casing, the electronic apparatus, or the like.

The junction 101 of the circuit board 102 is electrically connected to a GND 103 of the circuit board 102. A loop- or coil-shaped conductive pattern 104 for detecting the junction current is provided around the through hole for mounting the junction part. Lead-out portions 105 are formed at both ends of the conductive pattern and connected to a connector 106 for connecting to the measuring instrument or a cable.

The coil-shaped conductive pattern 104 for detecting the junction current may be formed by using wirings of each layer formed on a multilayer wiring board and viaholes for connecting the layers. Although FIGS. 1A and 1B show only one junction, there are generally a plurality of junctions on the circuit board and the coil-shaped conductive pattern 104 can be provided for every plural junctions 101 on the circuit board or may be also provided only for a part of the junctions 101. Further, a magnetic field detecting element such as a Hall element or the like may be used in place of the coil-shaped conductive pattern. It is also possible to construct in such a manner that, between the lead-out portion and the measuring instrument or in the measuring instrument, a measured voltage or current is rectified and detected by using a diode, a rectifier element, or the like and a current or voltage intensity is measured as a DC voltage. At this time, although a form of the diode or the rectifier is not limited, it is preferable to mount it onto the circuit board. These are true of the following embodiments.

Figure 2:
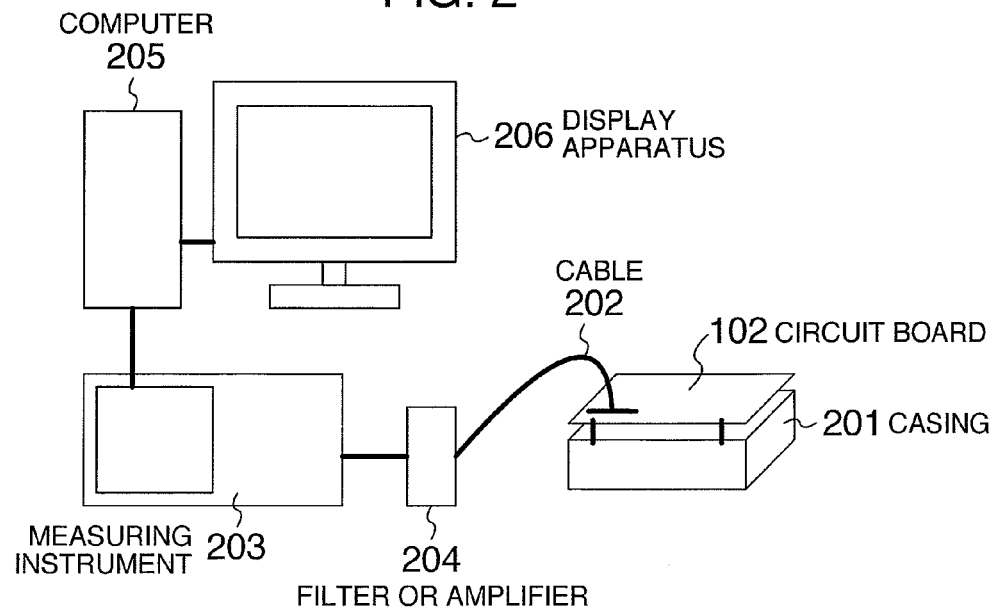
FIG. 2 is a constructional diagram of a measuring apparatus.

FIG. 2 shows an example of a construction of a measuring apparatus for measuring a current flowing in the junction of the circuit board 102 and a casing 201. Elements constructing the apparatus include: the circuit board 102 having the junction current detecting function; the casing 201; a connector or a cable 202 for transferring the detected junction current signal to the measuring instrument; a measuring instrument 203 for measuring the junction current signal from the circuit board; an amplifier or filter 204 for amplifying the junction current signal into a desired magnitude or extracting only a frequency component; a computer 205 having a CPU for calculating the current intensity and phase from a measured result of a voltage or an electric power, a memory, a storing apparatus in which a program for calculating them and the like have been stored, and the like; and a display apparatus 206 for displaying the measured result.

A conductor of the junction of the circuit board 102 is often electrically connected to the GND of the circuit board and is also electrically connected to the casing 201 in which the circuit board 102 is mounted or to the GND of the electronic apparatus or the like through the junction part such as a screw or the like.

In order to prevent spatial electromagnetic field distribution near a measuring target from being disturbed, it is necessary to keep a distance between the circuit board 102 having the junction current detecting function and the measuring apparatus including the filter or amplifier 204 so that they are not electromagnetically neighboring. The distance at which they are electromagnetically neighboring denotes a distance r at which a distance from the circuit board 102 or the casing 201 serving as a measuring target to the filter or amplifier 204 satisfies a relation of $r \leq \lambda/(2\pi)$.

Figure 15:
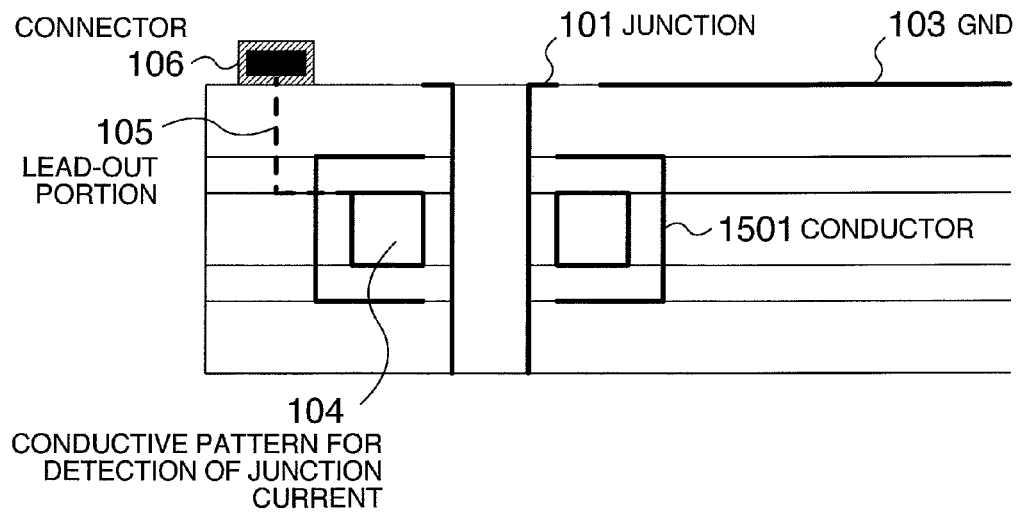
FIG. 15 is a cross sectional view of a structure of a second circuit board.

To suppress an influence of the electromagnetic field which is mixed from the outside, it is preferable to provide such a conductor as to cover the coil-shaped conductive pattern as shown in FIG. 15. By using such a construction, noises due to the electromagnetic field which is generated by the element or pattern on the circuit board can be suppressed, so that the junction current can be detected at high precision.

A junction current measuring procedure using the circuit board having the junction current detecting function and its principle will now be described.

As shown in FIG. 2, the circuit board 102 is mounted in the casing 201 or the like and made operative in the state where it is connected to the measuring instrument 203. The voltage which is induced in the conductive pattern for detecting the junction current is amplified into the desired frequency component or the desired signal intensity by the filter or amplifier 204 through the cable 202 and inputted to the measuring instrument 203. It is preferable that a measuring frequency of the filter can be arbitrarily set by combining a high-pass filter, a low-pass filter, or the like. The filtering or amplifying function of them can be also assembled onto the circuit board as will be explained hereinafter. The filtering function can be realized only by a passive element such as inductor, capacitor, or the like. The amplifying function can be easily realized on the circuit board by using an active element such as a transistor or the like. The measured results of the junction current obtained as mentioned above are successively stored into the storing apparatus of the computer 205.

Figure 3:
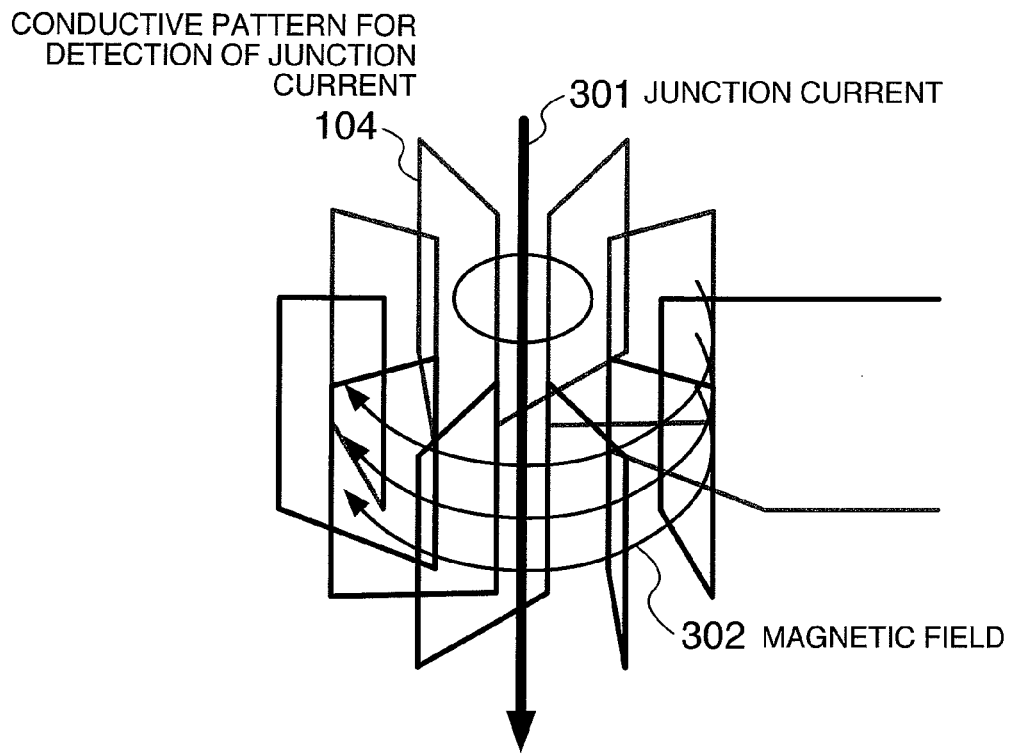
FIG. 3 is a diagram showing a detecting principle of a junction current.

FIG. 3 shows a detecting principle of the junction current.

As shown in the diagram, the coil-shaped conductive pattern 104 for detecting the junction current is electrically insulated from a center conductor through which a junction current 301 flows. It is necessary that a loop of at least one turn is formed in a plane perpendicular to a magnetic flux of a magnetic field 302 which is generated by the junction current. The junction current flows from the conductor such as a GND or the like on the circuit board to the casing through the junction part such as a screw or the like. When the magnetic flux generated by the junction current intersects the conductive pattern, a voltage is generated across the conductive pattern. The voltage generated at this time can be expressed by the following equation (1) by using a loop area S of the conductive pattern in the plane perpendicular to the magnetic flux, the number of loops N, magnetic permeability μ in the loop, a frequency f of the current, and magnetic field intensity H which is determined by the current intensity. The junction current can be reversely calculated from the measured voltage in consideration of those values.

$$V = 2 \cdot \pi \cdot f \cdot \mu \cdot S \cdot H \cdot N \tag{1}$$

If the number of turns N is increased, since an induced voltage increases, sensitivity to the current rises. However, since an output voltage at a high frequency drops by a capacitive coupling of the coils and an inductance of the coil-shaped conductive pattern 104 itself, it is preferable to change the value of N as necessary.

The frequency and intensity of the junction current can be known by measuring the voltage generated as mentioned above by the measuring instrument through the connector/cable or the like. In this instance, the pattern such as a GND or the like on the circuit board and the junction part such as a screw or the like as a junction need to be electrically conductive through a conductor provided for a periphery of an opening portion of the through hole, or the like. Since the circuit board, junction, and casing are respectively made conductive, the junction current can flow.

There are no limitations in a size and a shape of the junction part for mounting. It is preferable that the screw as a general junction part is formed in a circular shape. Although it is preferable to use a coaxial cable as a cable, it is not limited to the coaxial cable. Further, it is preferable to set a length of lead-out portion to be as short as possible.

A voltage Vm which is actually obtained by the measuring instrument can be estimated as shown by the following equation (2) by using an inductance value L of the conductive pattern for detecting the junction current and the lead-out portion. However, frequency characteristics can be also made constant by inserting a resistive element or a capacitive element serially or in parallel with the coil-shaped conductive pattern 104.

$$Vm = \frac{50}{50 + j \cdot 2 \cdot \pi \cdot f \cdot L} \cdot 2 \cdot \pi \cdot f \cdot \mu \cdot S \cdot H \cdot N \tag{2}$$

A procedure for reducing the unnecessary electromagnetic radiation by using a detection result of the junction current will now be described.

Generally, before mass-production of products, the circuit boards are produced on an experimental basis and a function and EMC performance are evaluated in the state where they have been mounted in the casing, electronic apparatus, or the like. At this time, if the unnecessary electromagnetic radiation exceeds a restriction value to be assured, by using the circuit board having the junction current detecting function according to the invention, the circuit board is mounted into the casing or the like and while it is being made operative, a current path on which the current serving as an unnecessary electromagnetic radiation source flows to the casing or the like can be known.

In general, the unnecessary electromagnetic radiation source is often an LSI, a power IC, or the like on the circuit board and a function of an antenna which irradiates the electromagnetic wave is often made by the casing or the like. The casing of the electronic apparatus is generally set to a GND electric potential and, in many cases, it is electrically connected to the GND electric potential of the circuit board. In many cases, the GND on the circuit board is unstable in an electric potential manner since the LSI, power IC, or the like operates. Thus, an electric potential difference occurs between the GND on the circuit board and the GND of the casing or the like and allows the current to flow to the casing. This current becomes an unnecessary electromagnetic radiation cause current.

Figure 4:
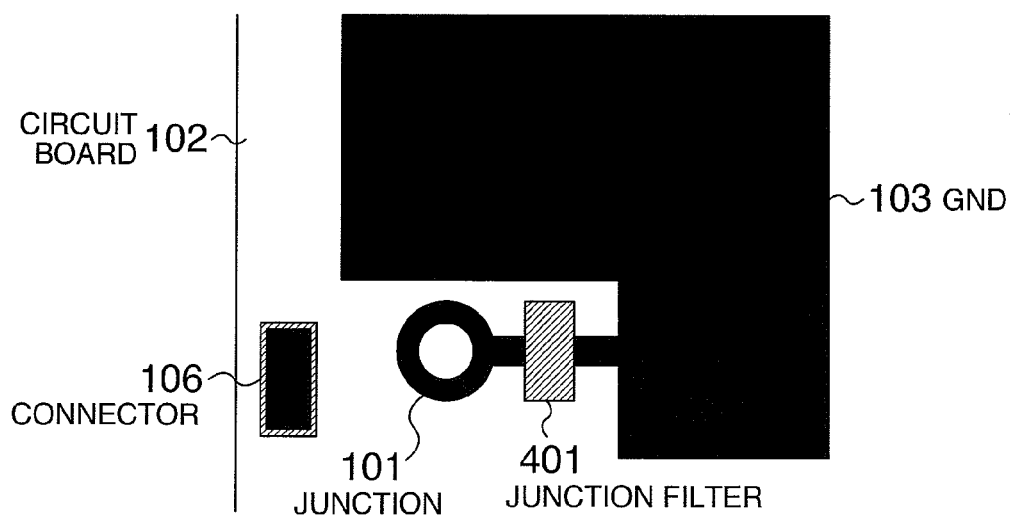
FIG. 4 is a top view including a junction filter of the circuit board.

To prevent the current from leaking from the circuit board to the casing or the like, as shown in FIG. 4, a junction filter 401 is inserted between the GND 103 on the circuit board 102 and the junction 101 electrically connected to the GND of the casing or the like. By adjusting electric characteristics of the inserted junction filter 401, the radiation from the casing can be reduced. The filter 401 can be provided for every plural junctions provided on the circuit board or may be also provided only for a part of the junctions. The electric characteristics of the filter can be more easily adjusted at higher precision in consideration of the signal characteristics of the junction current obtained by the circuit board having the junction current detecting function or the like according to the invention.

Specifically speaking, a frequency spectrum of the junction current is specified by a frequency spectrum of the unnecessary electromagnetic radiation from the system in which the circuit board has been mounted and by measurement of the junction current of the closer junction and the junction filter of the junction is reinforced or adjusted, so that the unnecessary electromagnetic radiation from the system can be reduced.

As a method of detecting the current or voltage of the junction, use of the circuit board having the function of detecting the junction current or the voltage according to the invention is preferable from a viewpoint of time reduction. However, the detecting method is not limited and the junction current or voltage can be also measured by using a current probe, a voltage probe, or the like.

An application example in which the detecting function of the junction current and the junction filter are electrically combined will now be described with reference to a circuit diagram.

Figure 5:
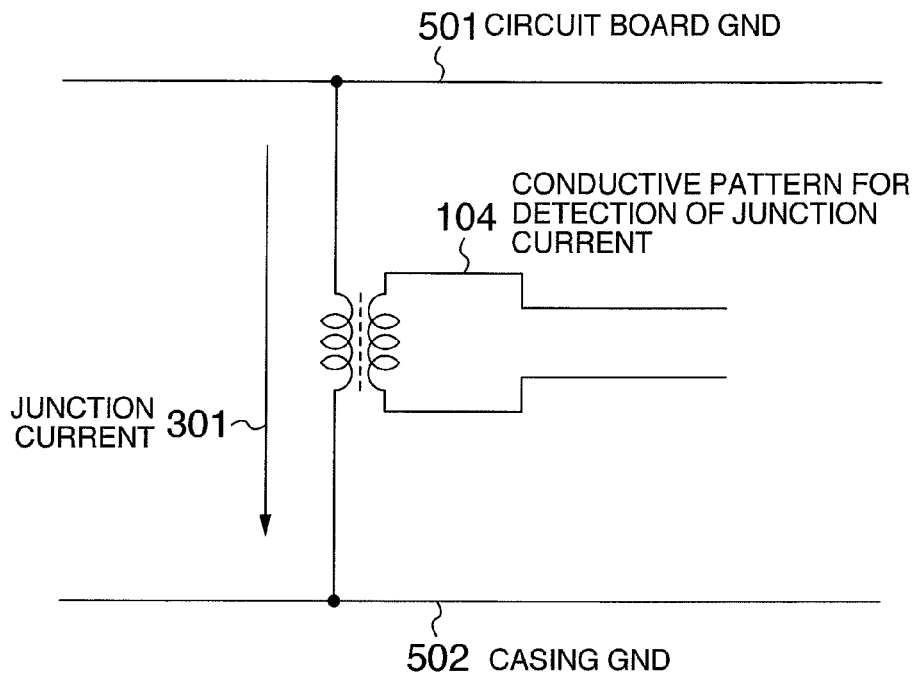
FIG. 5 is a diagram of an equivalent circuit showing a detection of the junction current.
Figure 6:
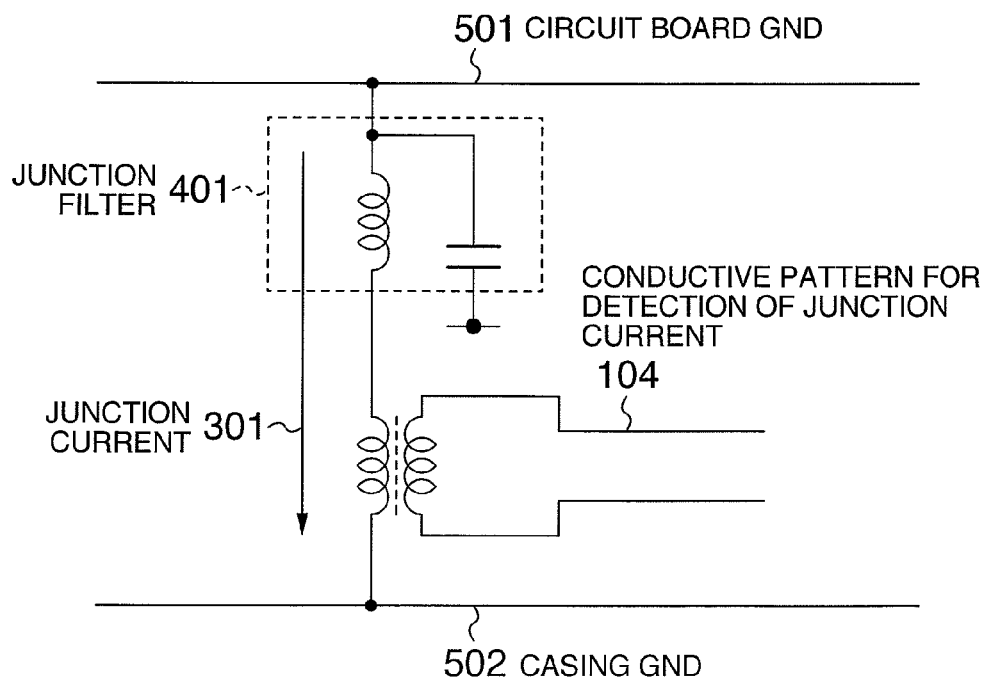
FIG. 6 is a circuit diagram showing the junction filter.

FIG. 5 shows a circuit equivalently showing the current flowing in the junction and the detecting circuit of the conductive pattern on the loop which have been described so far. FIG. 6 is a circuit showing the position of the filter mounted to the junction.

Figure 7:
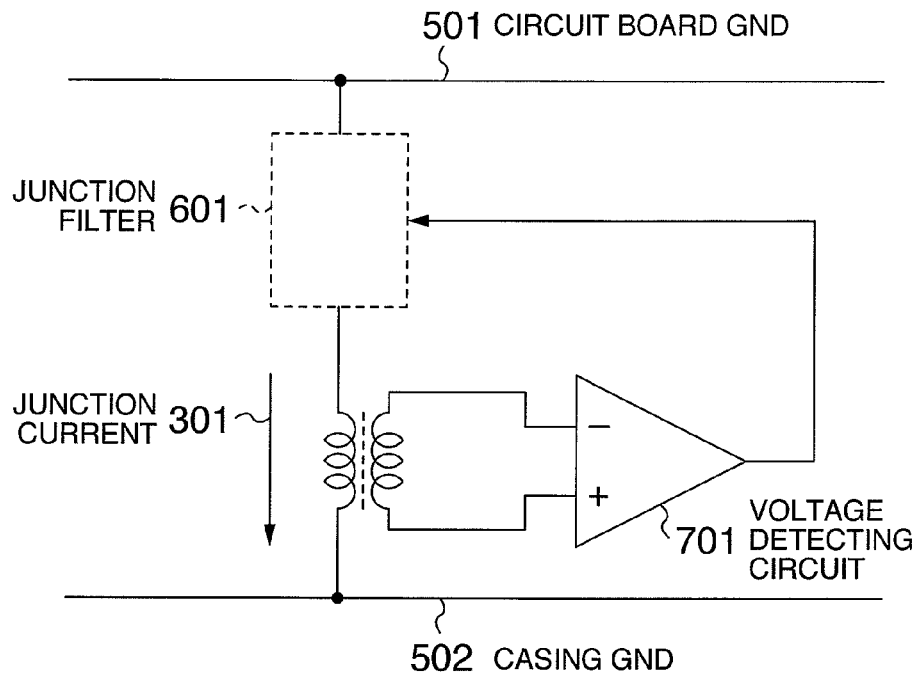
FIG. 7 is a circuit diagram showing a feedback function unit of the junction current.

A point that the current or voltage of the junction can be controlled by using the junction filter on the basis of the information of the detected current or voltage has been described. However, as shown in FIG. 7, it is also possible to construct in such a manner that a feedback function unit is provided and the information of the detected frequency, intensity, and phase of the junction current spectrum is used and electrically fed back to a filter 601 of the junction, thereby enabling the current which leaks from the circuit board to the casing or the like to be automatically suppressed.

Figure 8:
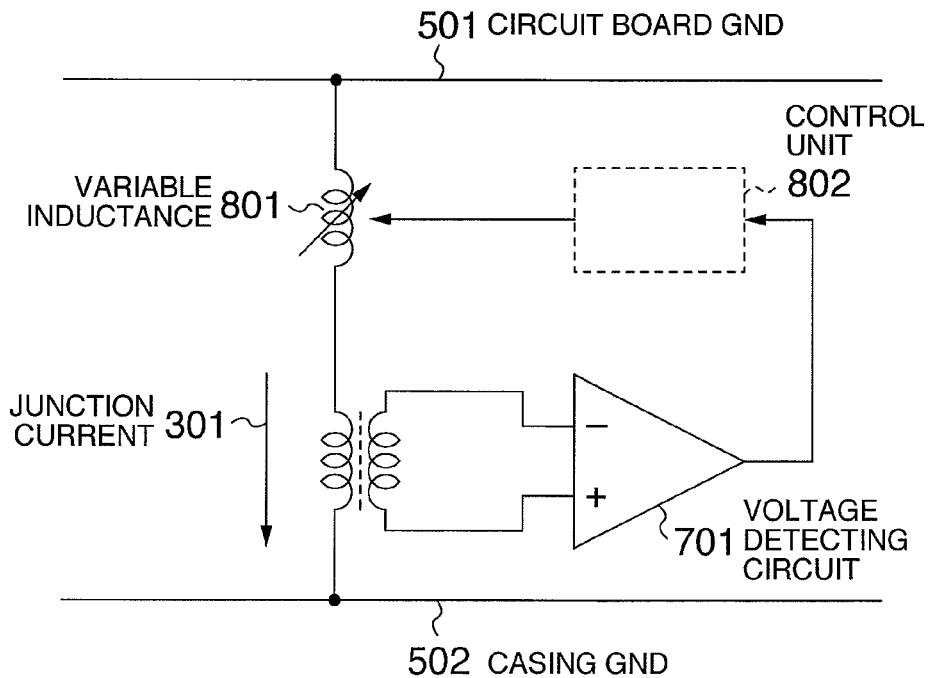
FIG. 8 is a circuit diagram showing a variable junction filter.
Figure 9:
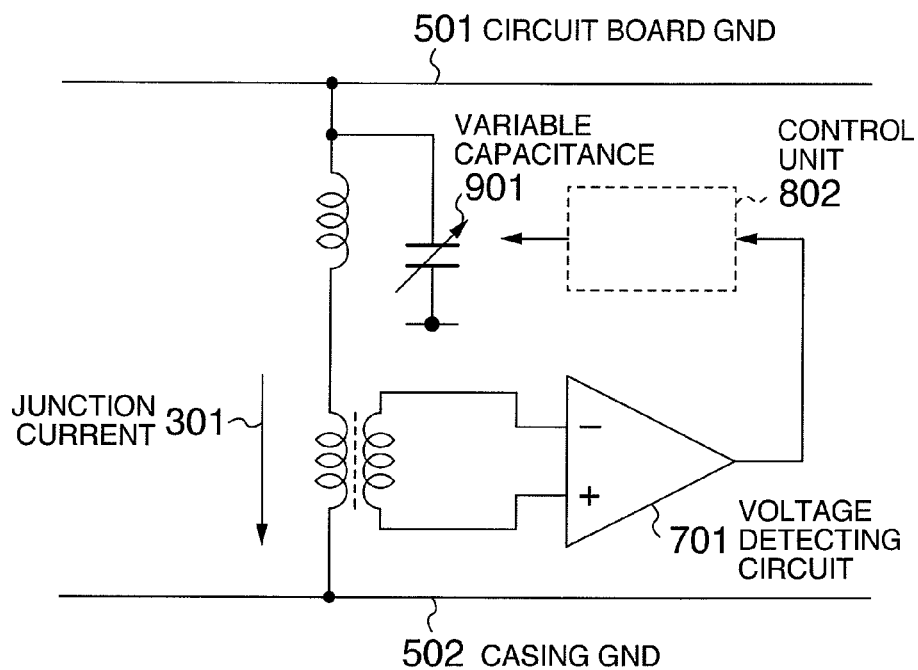
FIG. 9 is a second circuit diagram showing a variable junction filter.

Since the junction filter 601 can be realized by inductance and capacitance components, a feedback circuit for electrically adjusting a value of a variable inductance 801 as shown in FIG. 8 or a construction for similarly adjusting a value of a variable capacitance 901 as shown in FIG. 9 is considered. The inductance whose value is variable can be realized by combining an active element such as a transistor or the like or by utilizing an MEMS technique or the like. The inductance can be mounted as an IC or can be also realized by another method. This is true of the capacitance whose value is variable.

A control unit 802 of the feedback function unit can be also constructed in a circuit manner by using a microcomputer, another electric element, software, and the like. The filter can be also manually adjusted without using the automatic feedback construction.

By electrically feeding back the junction current signal to the junction filter as mentioned above, the countermeasure against the unnecessary electromagnetic radiation can be more easily realized at high precision.

It is also considered that if only the junction filter at one position is merely adjusted, the sufficient suppressing effect of the current which leaks from the circuit board to the casing or the like and becomes the cause of the unnecessary electromagnetic radiation from the casing cannot be obtained. This is because the leakage current depends on a balance of the GND electric potentials of the circuit board in the junctions at a plurality of positions or a balance of impedance values of the casing, so that it is necessary to consider a balance of the junction filters at a plurality of positions. Therefore, in the case of feeding back the junction current signal 301 to the adjustment of the junction filter, it is preferable to collectively input the information of the junction currents at a plurality of positions to the one control unit 802 and simultaneously adjust characteristics of the junction filter at one of the positions or of the junction filters at a plurality of positions on the basis of all of those information. In this instance, an algorithm for the feedback may be realized on the circuit board by using the microcomputer, a memory, or the like. There are no limitations in such a method.

Figure 10:
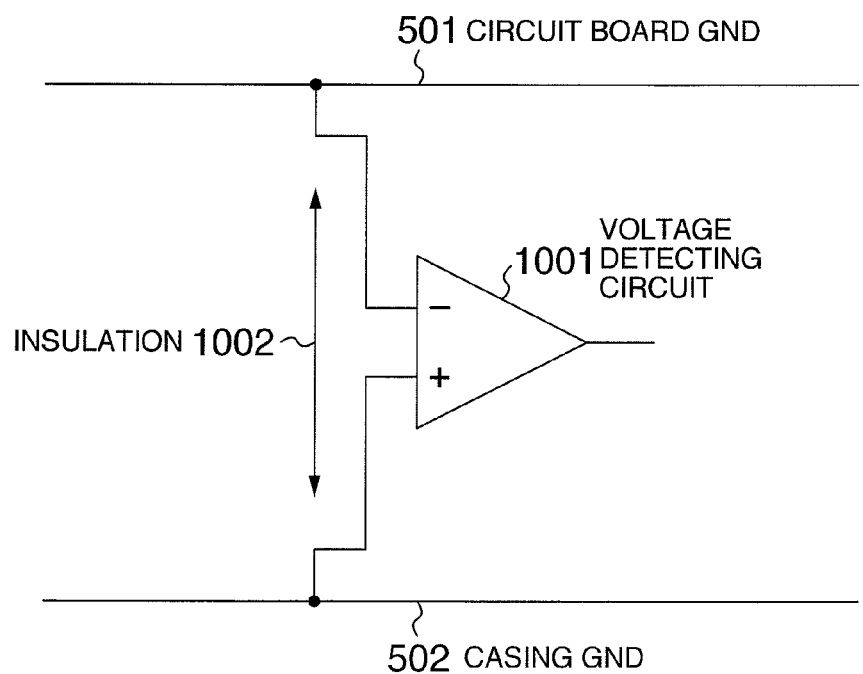
FIG. 10 is a circuit diagram showing a detecting system of a fluctuation of a junction potential.

Although the above description has been made on the assumption that the current flowing in the connecting portion is detected, it is also possible to use a method of presuming the junction current by measuring a fluctuation in the electric potential in the junction by using a voltage detecting circuit 1001 as shown in FIG. 10, or the like. Particularly, as an initial setting, in the case of an insulation 1002 in which the junction on the circuit board is not electrically connected to the casing or the like as shown in the diagram, or the like, in order to discriminate whether or not it is electrically connected, by measuring an electric potential fluctuation in the junction on the circuit board and considering it together with an impedance of the casing or the like, the junction current which is obtained in the case where it has been made conductive can be predicted. Generally, in the GND on the circuit board, although it is preferable that the position where the electric potential fluctuation is large is connected to the GND of the casing, since the leakage current also depends on stability of the GND of the casing, it is preferable to properly discriminate them on the basis of the information of the junction current or the electric potential.

Figure 11:
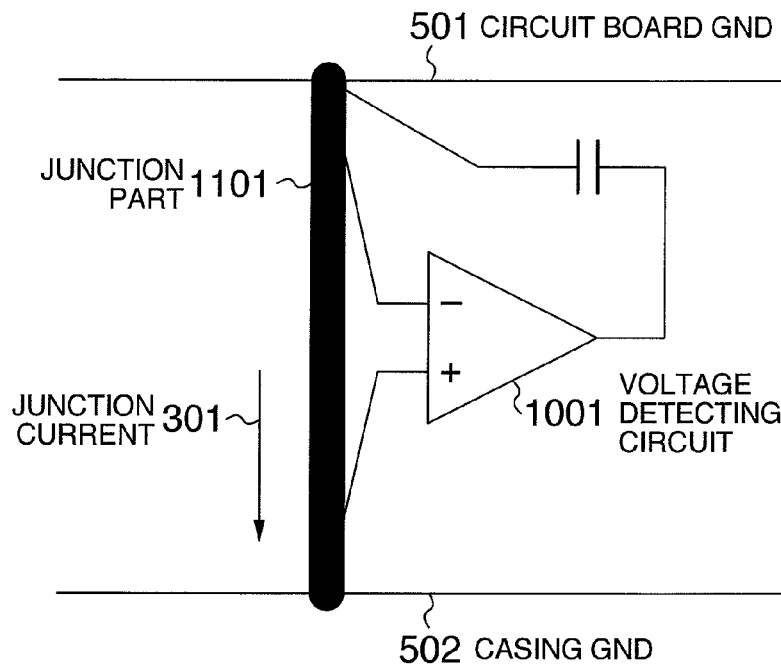
FIG. 11 is a circuit diagram showing a feedback function unit of the fluctuation of the junction potential.

In this instance, if a feedback circuit to suppress the detected voltage fluctuation as shown in FIG. 11 is formed and then the junction current control is made, the voltage fluctuation in the junction can be suppressed and the electric potential fluctuation of the casing can be suppressed. Although a voltage fluctuation suppressing circuit is conceptually expressed by a negative feedback circuit as shown in FIG. 11, actually, it can be realized by a combination of a transistor, an operational amplifier, and the like. There are no limitations in such a construction.

Figure 12:
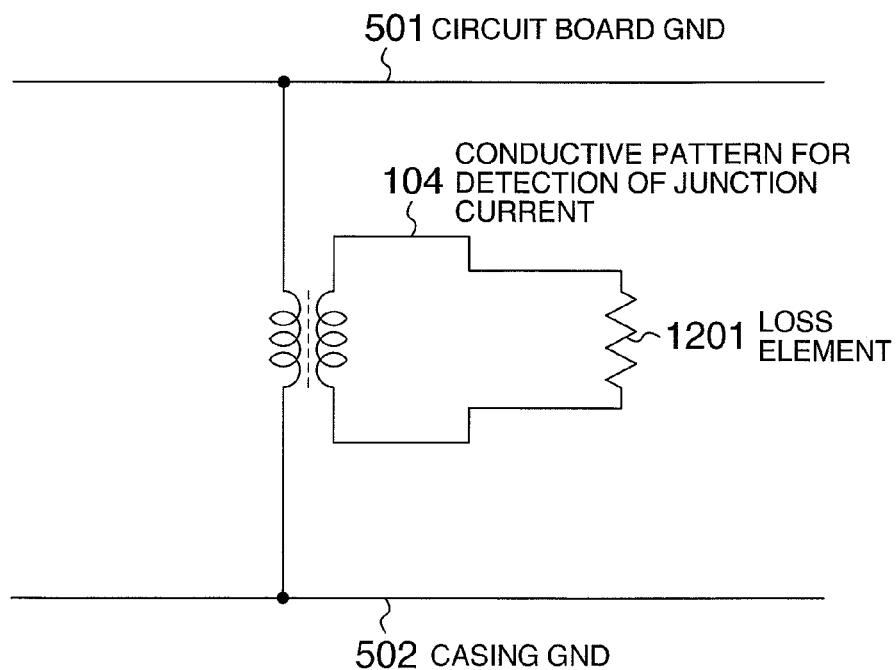
FIG. 12 is a circuit diagram showing a junction current control circuit.

As a method of controlling the junction current, the method of preventing the current from flowing to the outside such as a casing or the like by the filter using an inductor (L), a capacitor (C), or the like has been shown so far. However, there is also a method of converting the junction current into heat or the like by using an element such as a resistor whose loss is large as shown in FIG. 12. At this time, a Q value (Quality factor) of the detecting side changes depending on a resistance value of such a high-loss element such as a resistor or the like. The current intensity of the junction current can be controlled by adjusting the resistance value.

Figure 13:
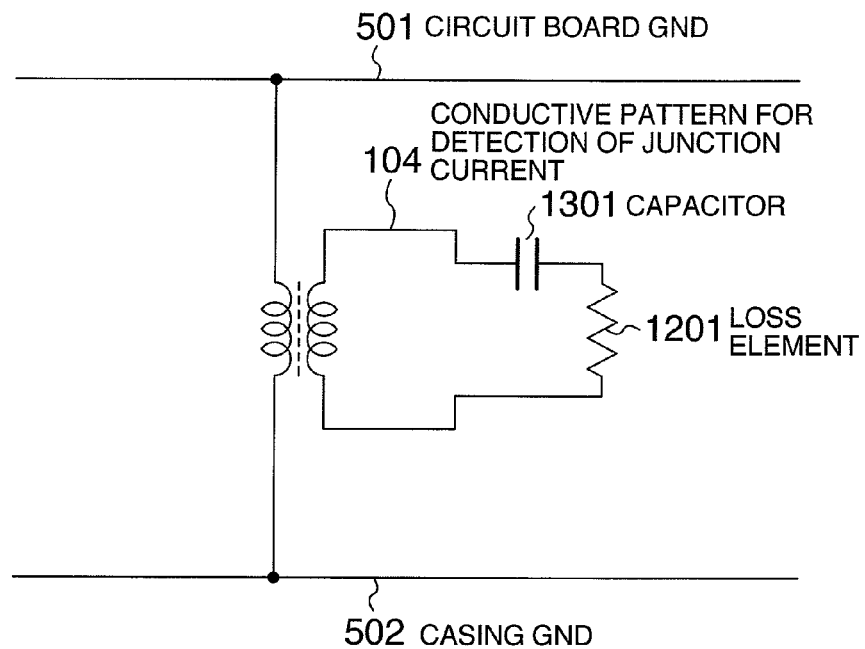
FIG. 13 is a second circuit diagram showing a junction current control circuit.
Figure 14:
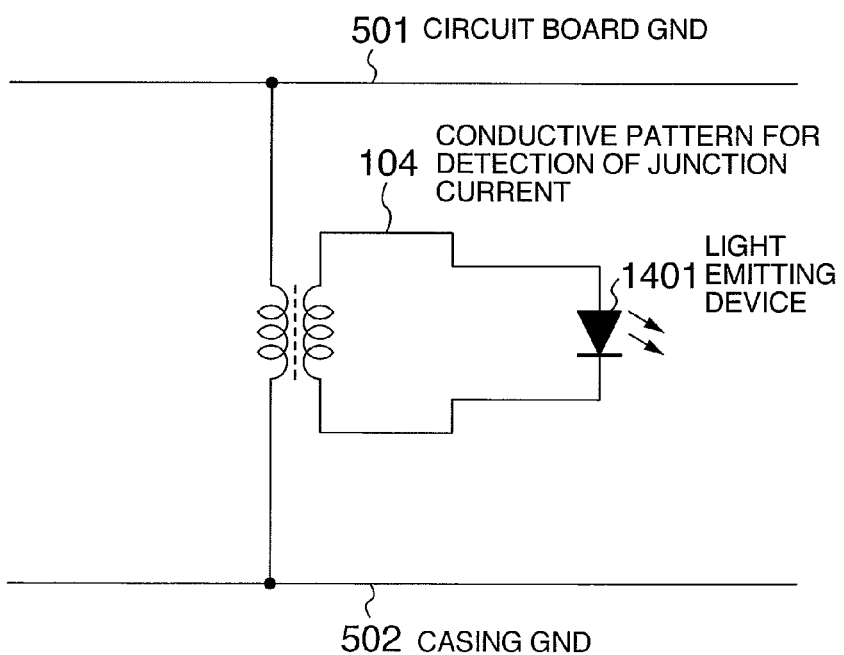
FIG. 14 is a third circuit diagram showing a junction current control circuit.

Further, by inserting a capacitor in series with L for detection of the junction current and generating a serial resonance as shown in FIG. 13, only a serial resonance frequency component of the junction current can be lost by the resistance component. In the actual countermeasure against the unnecessary electromagnetic radiation, a value of the capacitor is adjusted so as to obtain a frequency of the unnecessary electromagnetic radiation to be reduced and the intensity to be reduced is adjusted by the resistance value. At this time, the element which is used to suppress such a component is not limited only to the resistor but a light emitting element such as a light emitting diode or the like for converting the current into light as shown in FIG. 14 can be used. There are no limitations in such an element. By using such a construction, the junction current can be visually grasped and the effect of high-efficiently accomplishing the countermeasure against the unnecessary electromagnetic radiation can be expected.

An application example regarding the structure or the like shown above will now be described.

As a method of realizing the electric capacitor which is inserted in series with the coil-shaped conductor for detection of the junction current, there is a method of assembling a chip capacitor or the like. However, a capacitance of a parallel flat type capacitor by the conductive pattern between the boards can be also used.

There are no limitations in a shape which is used for the junction filter circuit. The inductance can be realized by a meander line or spiral pattern. The capacitance can be realized as a parallel flat type pattern by using a multilayer board.

Although PCB has been presumed for the circuit board, coil-shaped conductive pattern, lead-out portion, and the like used in the above description, there are no limitations in their materials or the like. The loss in high frequency characteristics can be reduced by using a ceramics board.

In order to raise the permeability in the loop of the coil-shaped conductive pattern, a high permeability material or a high dielectric constant material may be used in the circuit board or the coil-shaped pattern. Thus, an induced voltage by the junction current increases and even a smaller junction current can be detected.

Figure 16:
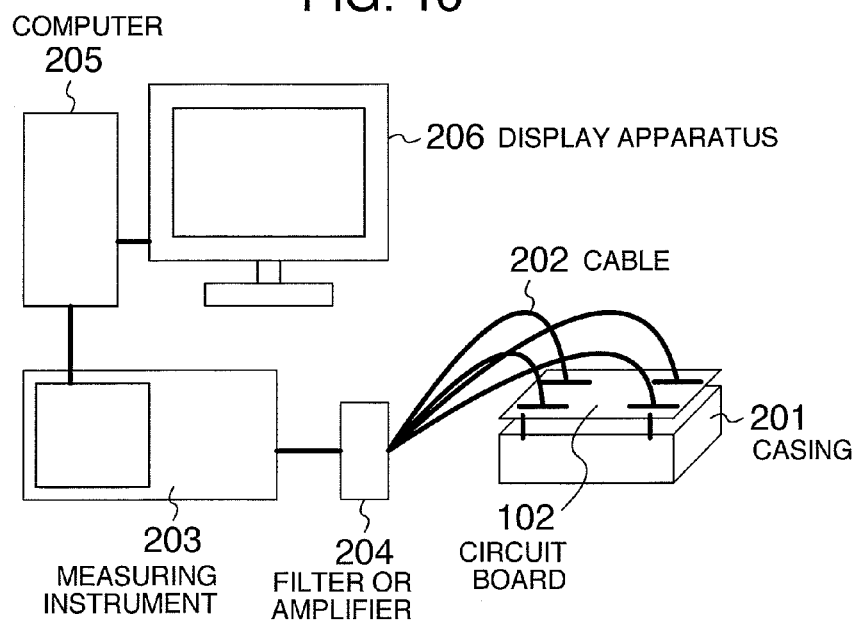
FIG. 16 shows a construction of a second measuring apparatus.

Although the construction in which one connector for the junction current detection is connected to one measuring instrument has been presumed so far, it is also possible to use a construction in which the junction currents at a plurality of positions are measured while being switched by using a selector or the like for a plurality of junction current detecting portions, or the like as shown in FIG. 16.

There are no limitations in a connecting method of the lead-out portions, connector, and cable. A connection using a solder or a detachable connecting structure using a small connector can be used. With such a structure, the junction current can be more easily measured.

As mentioned above, according to the invention, the current flowing in the junction of the circuit board and the electronic apparatus or the like and the casing can be measured in the actually mounted and operating state, the junction current can be more easily and efficiently adjusted and controlled, and the unnecessary electromagnetic radiation can be reduced.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

The invention claimed is:

1. A circuit board comprising:
a through hole provided in said circuit board and located to permit a connector to be inserted in said through hole to mount said circuit board to a casing or an electronic apparatus; and
a coil-shaped conductive pattern to permit measuring current flowing through said connector, said coil-shaped conductive pattern being provided on a plane extending along a longitudinal axis of the through hole, said plane extending through a center of the through hole located on said longitudinal axis to thereby intersect with a circumference of said through hole.

2. A circuit board comprising:
a through hole provided in said circuit board and located to permit a conductive junction part to be inserted in said through hole to mount said circuit board to a casing or an electronic apparatus; and
a conductive pattern formed around said through hole in said circuit board,
wherein said conductive pattern is a coil-shaped conductive pattern located in such a manner relative to said through hole that when a conductive junction part is mounted in said through hole, said conductive pattern intersects a magnetic flux of a magnetic field which is caused by a current flowing in said junction part to permit measuring said current.

3. The board according to claim 1, wherein
said circuit board is a multilayer wiring board and
a part of said conductive pattern is a viahole in said multilayer wiring board.

4. The board according to claim 1, further comprising:
a ground provided on a first plane of said circuit board;
a conductor which is electrically connected to said ground and provided at a periphery of an opening portion of said through hole; and
a filter provided between said ground and said conductor.

5. The board according to claim 4, wherein
said filter is a variable filter and
said conductive pattern and said filter are electrically connected through a feedback function unit.

6. The board according to claim 5, wherein said variable filter is a variable inductance.

7. The board according to claim 5, wherein said variable filter includes a variable capacitance.

8. The board according to claim 5, wherein said feedback function unit has a voltage detecting circuit and a control unit.

9. The board according to claim 8, wherein said control unit is a microcomputer.

10. An electronic apparatus comprising:
a casing;
a circuit board; and
a junction part which joins said casing and said circuit board,
wherein said circuit board includes a coil-shaped conductive pattern to permit measuring current flowing through said junction part, said coil-shaped conductive pattern being provided on a plane extending along a longitudinal axis of the junction part, said plane extending through a center of the junction part located on said longitudinal axis to thereby intersect a circumference of said junction part.

11. An electronic apparatus comprising:
a casing;
a circuit board; and
a junction part which joins said casing and said circuit board,
wherein said circuit board has a coil-shaped conductive pattern located relative to said junction part so as to intersect a magnetic flux of a magnetic field which is caused by a current flowing in said junction part to permit measuring said current.

12. The apparatus according to claim 10, wherein
said circuit board is a multilayer wiring board and
a part of said conductive pattern is a viahole in said multilayer wiring board.

13. The apparatus according to claim 10, wherein said circuit board has a connector which is electrically connected to said conductive pattern through a lead-out portion and can be connected to an external measuring instrument through a cable.

14. The apparatus according to claim 10, wherein a ground provided on a first plane of said circuit board and a ground of said casing are electrically connected through a filter provided for said circuit board.

15. The apparatus according to claim 14, wherein
said filter is a variable filter, and
said conductive pattern and said filter are electrically connected through a feedback function unit.

16. The apparatus according to claim 15, wherein
said circuit board and said casing are joined by junction parts at a plurality of positions, and
said circuit board has said conductive pattern, said filter, and said feedback function unit every said junction part.

17. The apparatus according to claim 16, wherein said feedback function unit has a voltage detecting circuit and a control unit.

18. The apparatus according to claim 16, wherein said plurality of feedback function unit of every said junction part have one control unit for a plurality of voltage detecting circuits of every said junction part.

19. The apparatus according to claim 18, wherein a junction current signal which is obtained every said junction part is collected by said one control unit and characteristics of said one filter or a plurality of said filters are adjusted on the basis of the collected signal.

20. The apparatus according to claim 14, wherein
said filter is automatically adjusted and
an unnecessary electromagnetic radiation caused by the electronic apparatus is automatically reduced.

\* \* \* \* \*